(12) United States Patent
Wang et al.

(10) Patent No.: US 10,177,132 B2
(45) Date of Patent: Jan. 8, 2019

(54) LAYOUT PATTERN FOR SRAM AND MANUFACTURING METHODS THEREOF

(71) Applicant: UNITED MICROELECTRONICS CORP., Hsin-Chu (TW)

(72) Inventors: Jun-Jie Wang, Changhua County (TW); Yu-Lin Wang, Taipei (TW); Tzu-Feng Chang, Pingtung County (TW); Wei-Chi Lee, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 246 days.

(21) Appl. No.: 15/088,122

(22) Filed: Apr. 1, 2016

(65) Prior Publication Data

US 2017/0243861 A1     Aug. 24, 2017

(30) Foreign Application Priority Data

Feb. 24, 2016    (TW) ............................... 105105522 A

(51) Int. Cl.

| | |
|---|---|
| *G06F 17/50* | (2006.01) |
| *H01L 27/02* | (2006.01) |
| *G03F 1/36* | (2012.01) |
| *G11C 11/419* | (2006.01) |
| *G11C 11/412* | (2006.01) |
| *H01L 27/11* | (2006.01) |

(52) U.S. Cl.
CPC ............ *H01L 27/0207* (2013.01); *G03F 1/36* (2013.01); *G06F 17/5068* (2013.01); *G11C 11/412* (2013.01); *G11C 11/419* (2013.01); *H01L 27/1104* (2013.01)

(58) Field of Classification Search
CPC ............. H01L 27/0207; H01L 27/1104; G11C 11/412; G11C 11/419; G06F 17/5068; G03F 1/36
See application file for complete search history.

(56) References Cited

U.S. PATENT DOCUMENTS

| | | | | |
|---|---|---|---|---|
| 4,999,519 A | * | 3/1991 | Kitsukawa | ......... H03K 19/0016 326/110 |
| 5,289,432 A | * | 2/1994 | Dhong | ...................... G11C 8/16 365/154 |
| 5,703,392 A | * | 12/1997 | Guo | ......................... H01L 27/11 257/392 |
| 6,084,820 A | * | 7/2000 | Raszka | ..................... G11C 8/16 365/230.05 |
| 6,091,626 A | * | 7/2000 | Madan | .................. G11C 11/412 365/154 |
| 6,528,897 B2 | * | 3/2003 | Kuwazawa | ........... G11C 11/412 257/204 |
| 6,535,453 B2 | * | 3/2003 | Nii | ........................... G11C 7/18 257/E27.099 |

(Continued)

*Primary Examiner* — Nha Nguyen
(74) *Attorney, Agent, or Firm* — Winston Hsu

(57) ABSTRACT

A layout pattern of a static random access memory, including a first inverter and a second inverter constituting a latch circuit. A first inner access transistor, a second inner access transistor, a first outer access transistor and a second outer access transistor are electrically connected to the latch circuit, wherein the first outer access transistor has a first gate length, the first inner access transistor has a second gate length, and the first gate length is different from the second gate length.

10 Claims, 6 Drawing Sheets

(56) References Cited

U.S. PATENT DOCUMENTS

| | | | | |
|---|---|---|---|---|
| 6,909,135 B2* | 6/2005 | Nii | | H01L 27/1104 257/297 |
| 6,934,182 B2* | 8/2005 | Chan | | G11C 11/412 365/154 |
| 7,825,437 B2 | 11/2010 | Pillarisetty | | |
| 8,638,592 B2* | 1/2014 | Badrudduza | | G11C 11/412 365/154 |
| 8,675,397 B2* | 3/2014 | Liaw | | G11C 8/16 365/154 |
| 8,908,421 B2 | 12/2014 | Liaw | | |
| 8,942,030 B2* | 1/2015 | Liaw | | H01L 27/11 365/154 |
| 9,202,552 B2* | 12/2015 | Paul | | G11C 11/412 |
| 9,305,633 B2* | 4/2016 | Grover | | G11C 11/412 |
| 9,515,076 B2* | 12/2016 | Nii | | H01L 27/1104 |
| 9,640,540 B1* | 5/2017 | Liaw | | H01L 27/1104 |
| 9,761,302 B1* | 9/2017 | Lu | | G11C 11/417 |
| 9,780,099 B1* | 10/2017 | Yeh | | H01L 27/1104 |
| 9,893,064 B2* | 2/2018 | Chung | | H01L 27/0924 |
| 9,972,629 B2* | 5/2018 | Nii | | H01L 27/1104 |
| 2005/0247981 A1* | 11/2005 | Wang | | G11C 7/02 257/369 |
| 2005/0253287 A1* | 11/2005 | Liaw | | G11C 8/16 365/230.05 |
| 2007/0025132 A1* | 2/2007 | Liaw | | G11C 5/063 365/63 |
| 2007/0034923 A1* | 2/2007 | Liaw | | H01L 21/28035 257/296 |
| 2007/0183185 A1* | 8/2007 | Guo | | G11C 11/412 365/156 |
| 2008/0019171 A1* | 1/2008 | Liaw | | G11C 11/412 365/174 |
| 2008/0123462 A1* | 5/2008 | Liaw | | G11C 8/16 365/230.05 |
| 2008/0197419 A1* | 8/2008 | Liaw | | H01L 27/11 257/368 |
| 2011/0317477 A1* | 12/2011 | Liaw | | G11C 8/16 365/156 |
| 2012/0001197 A1* | 1/2012 | Liaw | | H01L 27/11 257/77 |

* cited by examiner

US 10,177,132 B2

LAYOUT PATTERN FOR SRAM AND MANUFACTURING METHODS THEREOF

BACKGROUND OF THE INVENTION

1. Field of the Invention

The invention relates to a static random access memory (SRAM), and more particularly, to a SRAM having the advantage of decreasing the current differences in different regions.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as pitch of the exposure process decreases, it has been difficult for the current SRAM architecture to produce desirable patterns. Hence, how to enhance the current SRAM architecture for improving exposure quality has become an important task in this field.

SUMMARY OF THE INVENTION

The present invention provides a layout pattern of a static random access memory (SRAM), comprising a first inverter and a second inverter constituting a latch circuit, wherein the first inverter includes a first pull-up transistor (PL1) and a first pull-down transistor (PD1), and the second inverter includes a second pull-up transistor (PL2) and a second pull-down transistor (PD2), a first inner access transistor (PG2A) and a second inner access transistor (PG2B) electrically connected to the latch circuit, wherein the first inner access transistor is electrically connected to a first word line and a second bit line, and the second inner access transistor is electrically connected to a second word line and a fourth bit line, and a first outer access transistor (PG1A) and a second outer access transistor (PG1B) electrically connected to the latch circuit, wherein the first outer access transistor is electrically connected to the first word line and a first bit line, and the second outer access transistor is electrically connected to the second word line and a third bit line, in addition, the first outer access transistor (PG1A) has a first gate length, the first inner access transistor (PG2A) has a second gate length, and the first gate length is different from the second gate length.

The present invention further provides a method for forming a layout pattern of a static random access memory (SRAM), comprising: firstly, a first inverter and a second inverter are formed, to constitute a latch circuit, wherein the first inverter includes a first pull-up transistor (PL1) and a first pull-down transistor (PD1), and the second inverter includes a second pull-up transistor (PL2) and a second pull-down transistor (PD2), next, a first inner access transistor (PG2A) and a second inner access transistor (PG2B) which are electrically connected to the latch circuit are formed, wherein the first inner access transistor is electrically connected to a first word line and a second bit line, and the second inner access transistor is electrically connected to a second word line and a fourth bit line, and an ion implantation process is performed on the first inner access transistor or to the second inner access transistor.

The applicant found that due to the reasons such as the layout difference in different regions, the currents passing through different elements are different. In order to solve this issue, the present invention provides a layout pattern of a SRAM and the manufacturing method for forming the layout pattern thereof. The present invention provides two methods: by performing an OPC process and by performing an ion implantation process to solve the issue mentioned above, the current differences in different regions can thereby be decreased and the quality of SRAM can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
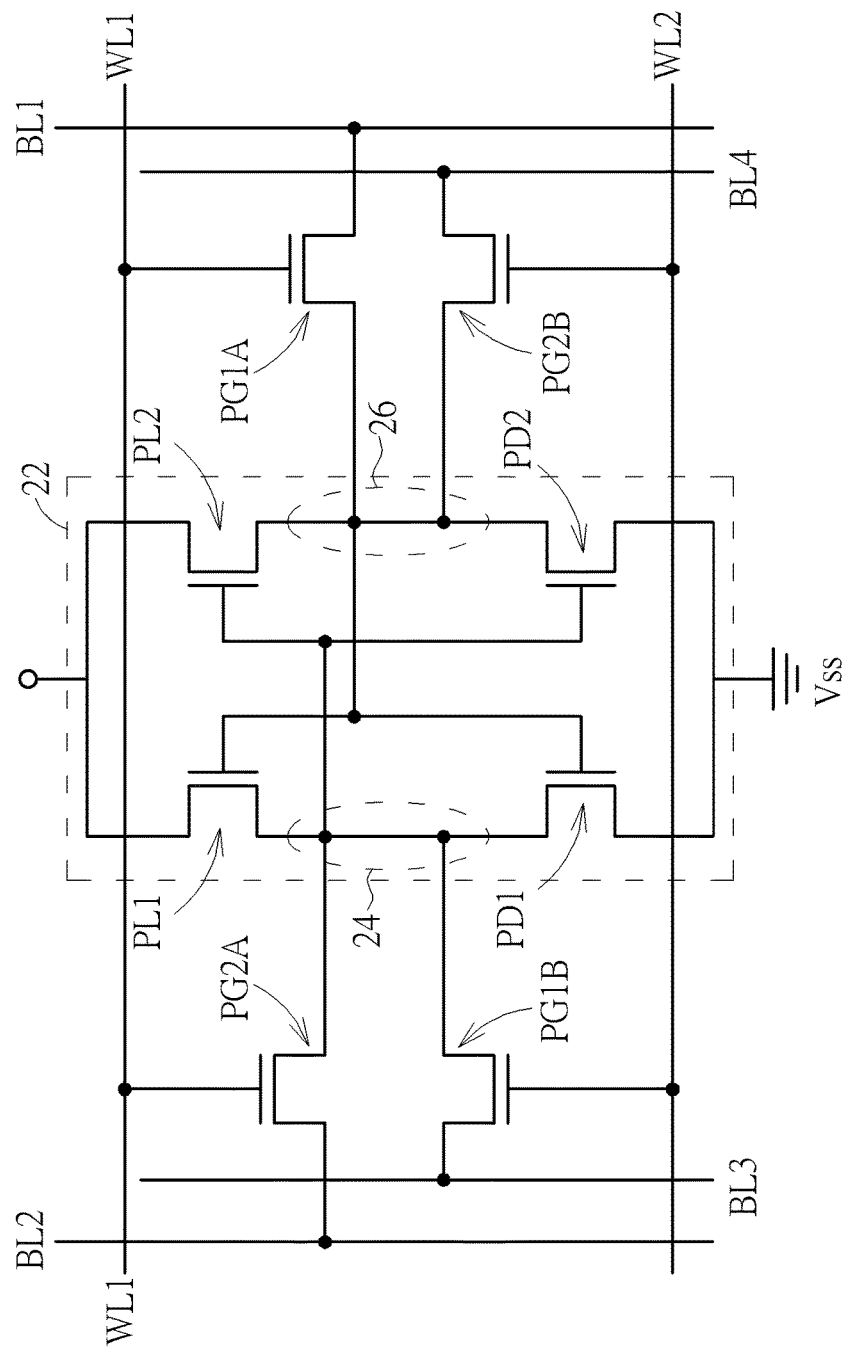
FIG. 1 illustrates a circuit diagram of a SRAM cell according to a first preferred embodiment of the present invention.
Figure 2:
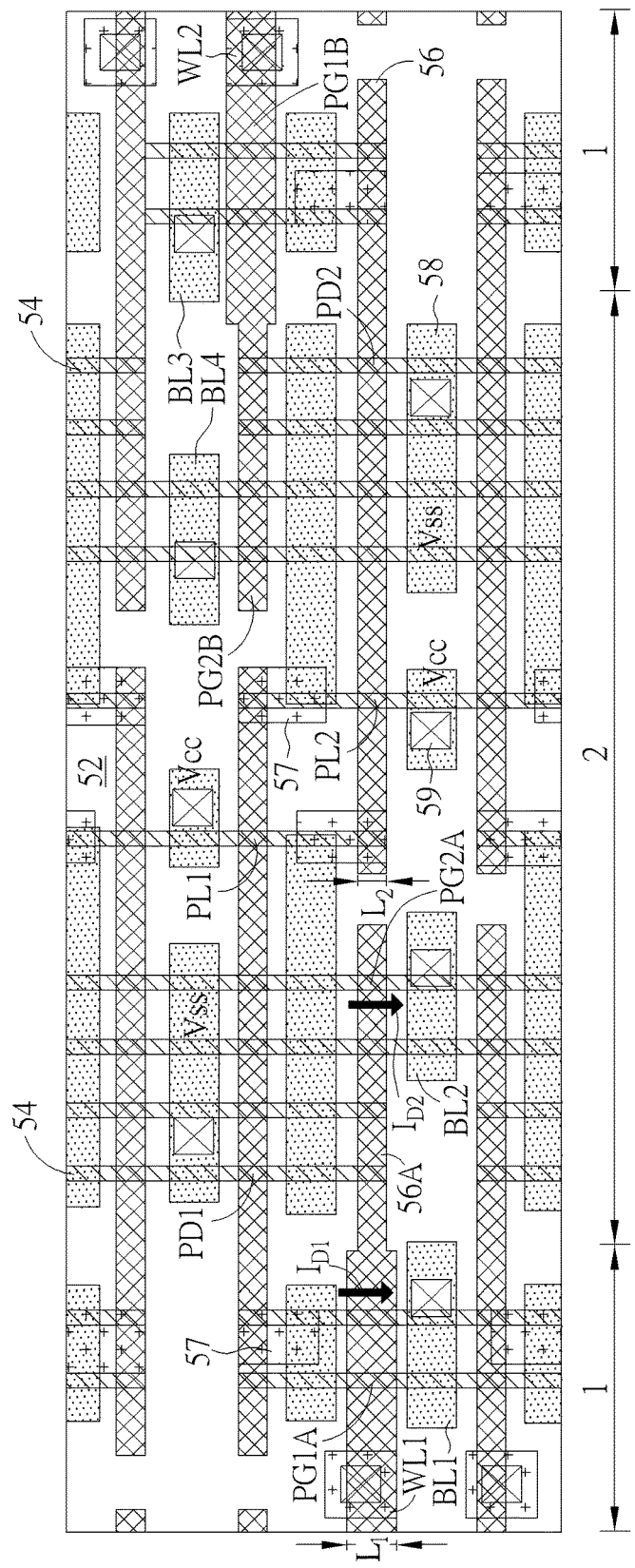
FIG. 2 illustrates a layout diagram of a SRAM according to a first preferred embodiment of the present invention.

Referring to FIGS. 1-2, FIG. 1 illustrates a circuit diagram of a SRAM cell according to a first preferred embodiment of the present invention, and FIG. 2 illustrates a layout diagram of a SRAM according to the first preferred embodiment of the present invention.

As shown in FIGS. 1-2, the SRAM device of the present invention preferably includes at least one SRAM cell, each SRAM cell including an eight-transistor SRAM (8T-SRAM) cell 10.

In this embodiment, each 8T-SRAM cell 10 is composed of a first pull-up transistor PL1, a second pull-up transistor PL2, a first pull-down transistor PD1, a second pull-down transistor PD2, a first outer access transistor PG1A, a second outer access transistor PG1B, a first inner access transistor PG2A and a second inner access transistor PG2B. These eight transistors constitute a set of flip-flops. The first and the second pull-up transistors PL1 and PL2, and the first and the second pull-down transistors PD1 and PD2 constitute a latch circuit 22 that stores data in the storage nodes 24 and 26. Since the first and the second pull-up transistors PL1 and PL2 act as power load devices, they can be replaced by resistors. Under this circumstance, the static random access memory becomes a four-transistor SRAM (4T-SRAM). In this embodiment, the first and the second pull-up transistors PL1 and PL2 preferably share a source/drain region and electrically connect to a voltage source Vcc, and the first and the second pull-down transistors PD1 and PD2 share a source/drain region and electrically connect to a voltage source Vss.

Preferably, the first pull-up transistor PL1 and the first pull-down transistor PD1 constitute an inverter. Similarly, the second pull-up transistor PL2 and the second pull-down transistor PD2 constitute another inverter. In addition, the storage node 24 is connected to the respective gates of the second pull-down transistor PD2 and the second pull-up transistor PL2. The storage node 24 is also connected to the drains of the first pull-down transistor PD1, the first pull-up transistor PL1, the first inner access transistor PG2A, and the second outer access transistor PG1B. Similarly, the storage node 26 is connected to the respective gates of the first pull-down transistor PD1 and first the pull-up transistor PL1. The storage node 26 is also connected to the drains of the second pull-down transistor PD2, the second pull-up transistor PL2, the first outer access transistor PG1A and the second inner access transistor PG2B. The gates of the first outer access transistor PG1A and the first inner access transistor PG2A are respectively coupled to a first word line (WL1); the gates of the second outer access transistor PG1B and the second inner access transistor PG2B are respectively coupled to a second word line (WL2); the source of the first outer access transistor PG1A is coupled to a first bit line (BL1), the source of the first inner access transistor PG2A is coupled to a second bit line (BL2), the source of the second outer access transistor PG1B is coupled to a third bit line (BL3), and the source of the second inner access transistor PG2B is coupled to a fourth bit line (BL4).

In this embodiment, an 8 transistors dual port SRAM (8TDP-SRAM) cell 10 is disposed on a substrate 52, such as a silicon substrate or silicon-on-insulator (SOI) substrate. The substrate may be a planar substrate, or a plurality of fin structures 54 may be formed on the substrate 52. Next, pluralities of gate structures 56 are formed on the substrate 52. In this embodiment, take an 8T-SRAM with fin structures 54 as an example, but the present invention is not limited thereto. In another case, the planar SRAM (the SRAM without comprising fin structures) may also be comprised within the scope of the present invention. Besides, in this embodiment, a plurality of contact structures 57, 58 are disposed on the substrate 52, and a plurality of contact plugs 59 which are electrically connected to the contact structures 57, 58. The other structure features and the operation principle of 8TDP-SRAM are well known to those skilled in the art, and will not be redundantly described here.

Please refer to FIG. 2 again, in the layout pattern of each 8TDP-SRAM cell 10, the region that is relatively closer to the latch circuit (the composition of the first pull-up transistor PL1, the first pull-down transistor PD1, the second pull-up transistor PL2 and the second pull-down transistor PD2 in FIG. 1) is defined as an inner region 2. On the other hand, the region that is relatively far apart from the latch circuit is defined as an outer region 1. Therefore, the "inner" and the "outer" in the names of the first outer access transistor PG1A, the second outer access transistor PG1B, the first inner access transistor PG2A and second inner access transistor PG2B also show these transistors disposition within the outer region 1 or disposition within the inner region 2. For example, both the first outer access transistor PG1A and the second outer access transistor PG1B are disposed within the outer region 1; the first inner access transistor PG2A and the second inner access transistor PG2B are disposed within the inner region 2.

The applicant found that during the operation of SRAM, due to the reasons such as the layout difference in different regions, or the energy consumption, etc. . . . one issue may occur: the current passing through the elements within the inner region is different from the current passing through the elements within the outer region. For example, in 28 nanometers (nm) 8TDP-SRAM, according to the experiment of the applicant, the current ID1 that passes through the first outer access transistor PG1A (the current that passes from the source of the PG1A to the drain of the PG1A) or passes through the second outer access transistor PG1B is about 120-130 micro amperes (μA), however, the current ID2 that passes through the first inner access transistor PG2A (the current that passes from the source of the PG2A to the drain of the PG2A) or passes through the second inner access transistor PG2B is lower than ID1, it is about 95-100 μA. In other words, in 28 nm 8TDP-SRAM, compared with the current ID1 passing through the outer region 1, the current ID2 passing through the inner region 2 is decreased about 20-30%.

The issue mentioned above may influence the operation of SRAM, or further decrease the yield for manufacturing the SRAM. One purpose of the present invention is to solve the issue mentioned above, in other words, to decrease the current differences in different regions.

Please refer to FIG. 2 again, which illustrates a layout diagram of a SRAM according to a first preferred embodiment of the present invention. Take the first outer access transistor PG1A and the first inner access transistor PG2A as an example, it is noteworthy that the gate of the first outer access transistor PG1A directly contacts the gate of the first inner access transistor PG2A. More precisely, in this embodiment, the first outer access transistor PG1A and the first inner access transistor PG2A comprise a same gate structure (labeled as 56A in FIG. 2). In other words, a gate of the first outer access transistor PG1A and a gate of the first inner access transistor PG2A are arranged along a same symmetry axis, similarly, a gate of the second outer access transistor PG1B and a gate of the second inner access transistor PG2B are arranged along a same symmetry axis too. However, the current ID2 passing through the first inner access transistor PG2A is smaller than the current ID1 passing through the first outer access transistor PG1A about 20%. Please also refer to the equation 1 as below:

$$I_{DS} = \mu_n C_{ox} W/L [(V_{GS} - V_{th}) V_{DS} - V^2_{DS}/2]$$ Equation 1 wherein:
$I_{DS}$ is the current passing through the transistor;
W is the gate width (the channel width) of the transistor;
L is the gate length (the channel length) of the transistor;
$\mu_n$ is the carrier mobility;
$C_{ox}$ is the unit capacitance of the gate oxide layer;
$V_{GS}$ is the voltage from the gate to the source;
$V_{DS}$ is the voltage from the drain to the source; and
$V_{th}$ is the threshold voltage.

According to equation 1, it shows that the current passing through the transistor is proportional to the gate width W (the channel width) of the transistor, but it is inversely proportional to the gate length L (the channel length) of the transistor. In other words, if other conditions are fixed, the smaller the gate length L is, the larger the current passing through the transistor is. Therefore, as the issue that the current difference in different regions occurs, by adjusting the gate length L in different regions, the current can be changed again, and thereby eliminate the current differences.

More precisely, as shown in FIG. 2, the gate length of the first outer access transistor PG1A is labeled as L1, and gate length of the first inner access transistor PG2A is labeled as L2, by performing an optical proximity correction (OPC) process, to adjust the gate length L1 of the first outer access transistor PG1A, or to adjust the gate length L2 of the first inner access transistor PG2A. In this embodiment, if the ratio between the gate length L1 and the gate length L2 is adjusted, the ration of the current ID1 passing through the first outer access transistor PG1A and the current ID2 passing through the first inner access transistor PG2A can be changed. For example, in one embodiment, the gate length L1 is fixed at 24 nm, and the gate length L2 is changed by the OPC process, to decrease the gate length L2 to about 20 nm, in this way, since the current passing through the transistor is inversely proportional to the gate length L of the transistor, after the OPC process, the current ID1 is not changed, but the current ID2 is increased, so the current differences between the current ID1 and the current ID2 can be decreased, to solve the issue mentioned above.

It can be understood that the OPC process of the present invention is not only limited to adjust the gate length L2, it can also be used for adjusting the gate length L1. In this embodiment, since the current ID1 is larger than the current ID2, so the gate length L2 should be adjusted to be smaller than the gate length L1. Preferably, the ration between the gate length L2 and the gate length L1 is between 0.58-0.99. In addition, in 28 nm SRAM, the gate length L2 is preferably between 14-24 nm, but is not limited thereto. Those parameters mentioned above can be adjusted according to actual requirements.

Furthermore, in another case, the gate lengths of the other two transistors of the 8TDP-SRAM cell 10, the second outer access transistor PG1B and the second inner access transistor PG2B (labeled as the gate length L3 and the gate length L4 in FIG. 2), can also be simultaneously adjusted by the OPC process mentioned above or by another OPC process in different steps. After the OPC process, the gate length L3 is adjusted to enlarge the gate length L4, therefore the current differences between the current passing through the second outer access transistor PG1B and the current passing through the second inner access transistor PG2B can be decreased, and it should also be within the scope of the present invention.

In the first preferred embodiment above, the ratio between different gate lengths is changed by further performing an OPC process, thereby decreasing the current differences in different regions and improving the quality of SRAM.

The following description will detail the different embodiments of the SRAM of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
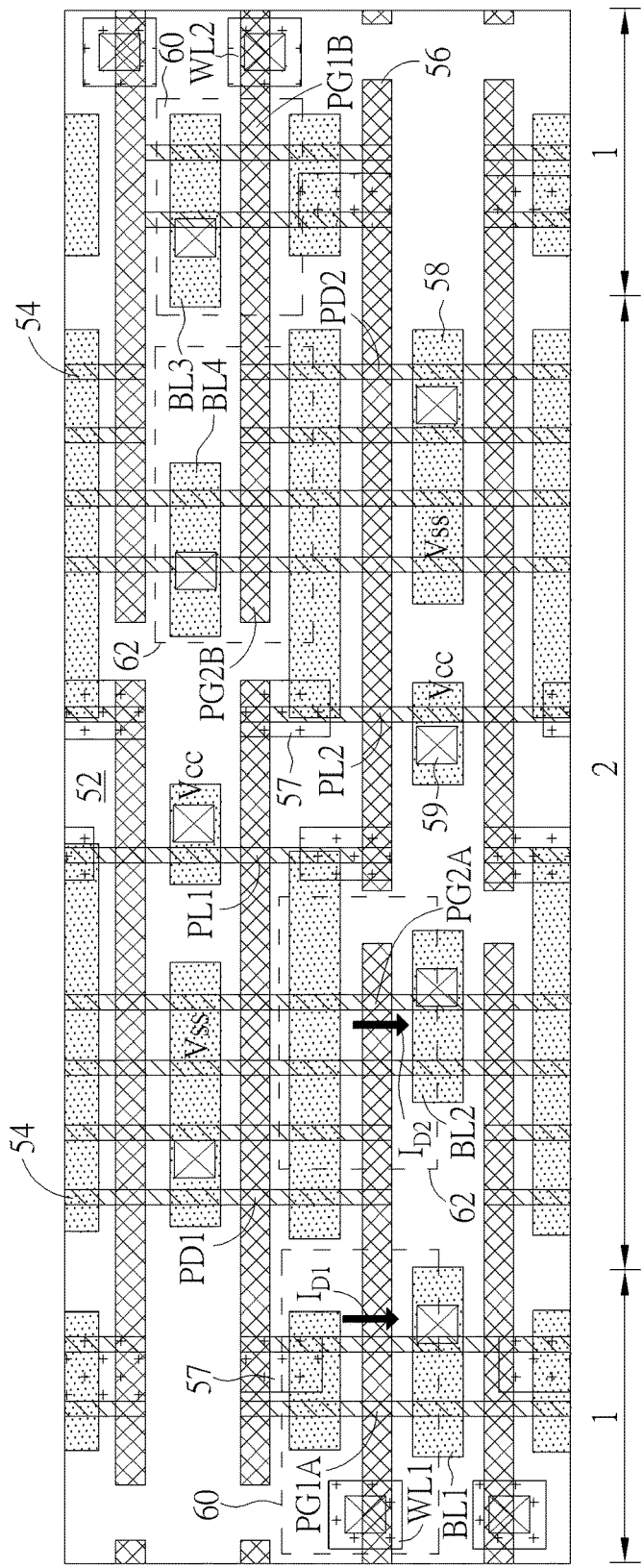
FIG. 3 illustrates a layout diagram of a SRAM according to a second preferred embodiment of the present invention.

Please refer to FIG. 3, which illustrates a layout diagram of a SRAM according to a second preferred embodiment of the present invention. Similar to the first preferred embodiment, this embodiment also comprises at least one eight-transistor dual port SRAM (8TDP-SRAM) cell 10, and has the same circuit diagram as the first preferred embodiment has (please refer to FIG. 1). As shown in FIG. 1 and FIG. 3, the 8TDP-SRAM cell 10 comprises a latch circuit 22, and the latch circuit 22 includes a first pull-up transistor PL1, a second pull-up transistor PL2, a first pull-down transistor PD1 and a second pull-down transistor PD2. In addition, the 8TDP-SRAM cell 10 also comprises a first outer access transistor PG1A, a second outer access transistor PG1B, a first inner access transistor PG2A and a second inner access transistor PG2B. Similarly, an outer region 1 and an inner region 2 are defined on the substrate 52.

The purpose of this embodiment is same as the purpose of the first preferred embodiment: to decrease the current differences between the current passing through the transistor within the outer region and the current passing through the transistor within the inner region. In this embodiment, for example, a current measurement process can be performed on the first outer access transistor PG1A and on the first inner access transistor PG2A, so as to obtain the current ID1 passing through the first outer access transistor PG1A and the current ID2 passing through the first inner access transistor PG2A. According to the applicant's experiment, due to the layout difference in different regions or other reasons, the current ID1 should larger than the current ID2. Usually, the ratio of the current ID1 to the current ID2 is larger than 1.20, but is not limited thereto. Therefore, one purpose of this embodiment is to decrease the current differences in different regions.

The difference between this embodiment and the first preferred embodiment is in this embodiment, an ion implantation process is performed on the substrate 52 within the outer region 1 or within the inner region 2, to dope or implant the suitable ions into the substrate 52 within the outer region 1 or within the inner region 2, and to form the doping region 60 (within the outer region 1) or to form the doping region 62 (within the inner region 2). In this way, the threshold voltage of each transistor can be changed, so as to decrease the current ID1 within the outer region 1 or to increase the current ID2 within the inner region 2. More precisely, take a n-type transistor (NMOS) as an example, by doping the phosphorus (P) ions or the arsenic (As) ions into the substrate 52 within the inner region 2, to help increase the current passing through the NMOS (the current from the source to the drain of the NMOS), in this way, the current ID2 can be increased. Or in another case, by doping the boron (B) ions or the boron fluoride (BF) ions into the substrate 52 within the outer region 1, this helps to decrease the current ID1. According to the applicant's experiment, the current ID2 will be decreased about 9% when doping per $10^{13}$ (1/cm$^2$) concentration BF ions into the substrate within the outer region 1. Therefore, by adjusting the concentration of the doping ions, the current differences between the current ID1 and the current ID2 can be effectively decreased.

It is noteworthy that the first preferred embodiment and the second preferred embodiment can be combined together. In other words, in one case, an OPC process and an ion implantation process can be performed on a same 8TDP-SRAM, so as to adjust the gate length and also to change the threshold voltage, and to change the current passing through the transistor. It should also be within the scope of the present invention.

The current difference issue mentioned above not only occurs in 8TDP-SRAM, it may also occur in other SRAM structures, such as 8-transistor register file (8TRF-SRAM) or the SRAM including more transistors (such as 10T-dual port SRAM).

Figure 4:
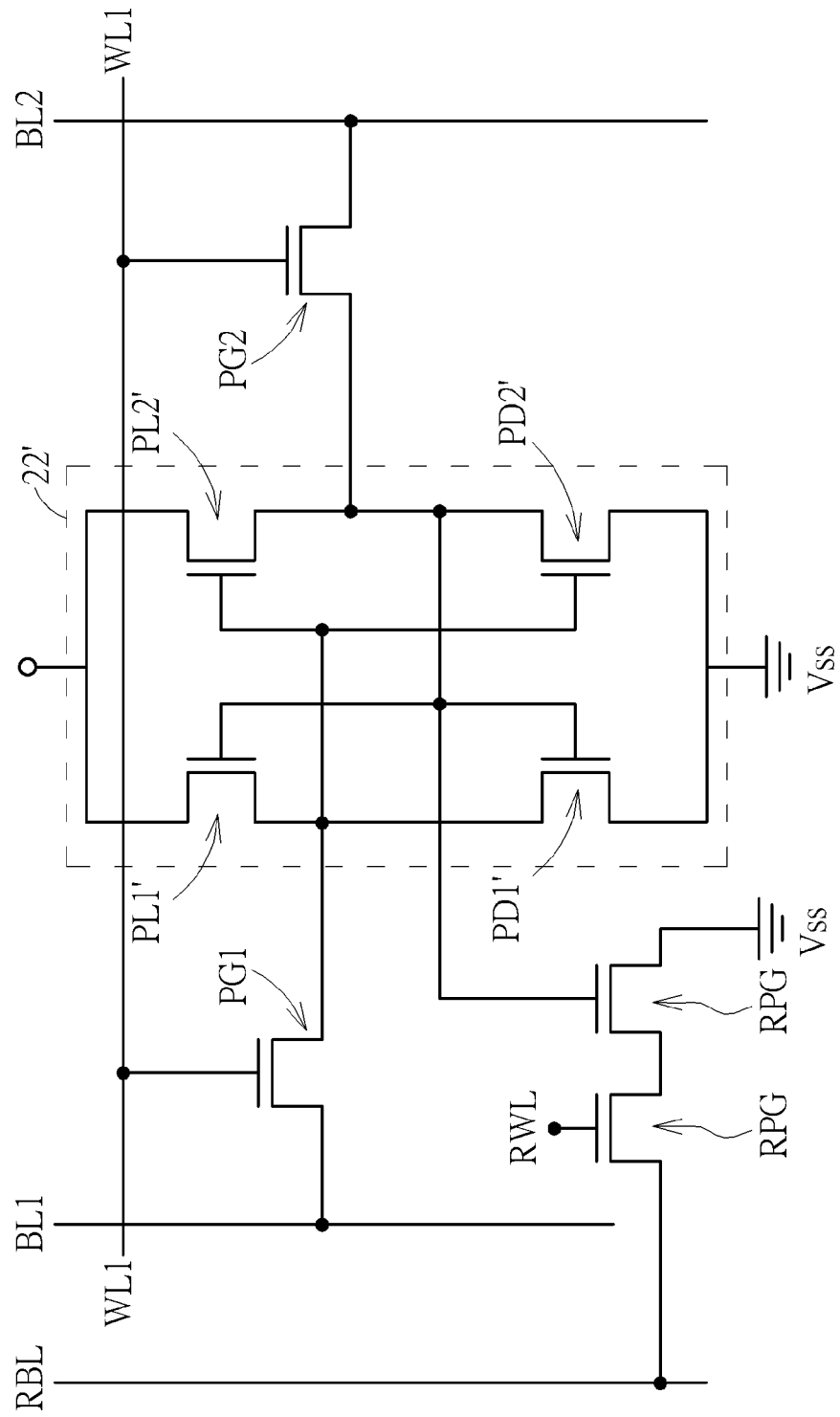
FIG. 4 illustrates a circuit diagram of a SRAM cell according to a third preferred embodiment of the present invention.
Figure 5:
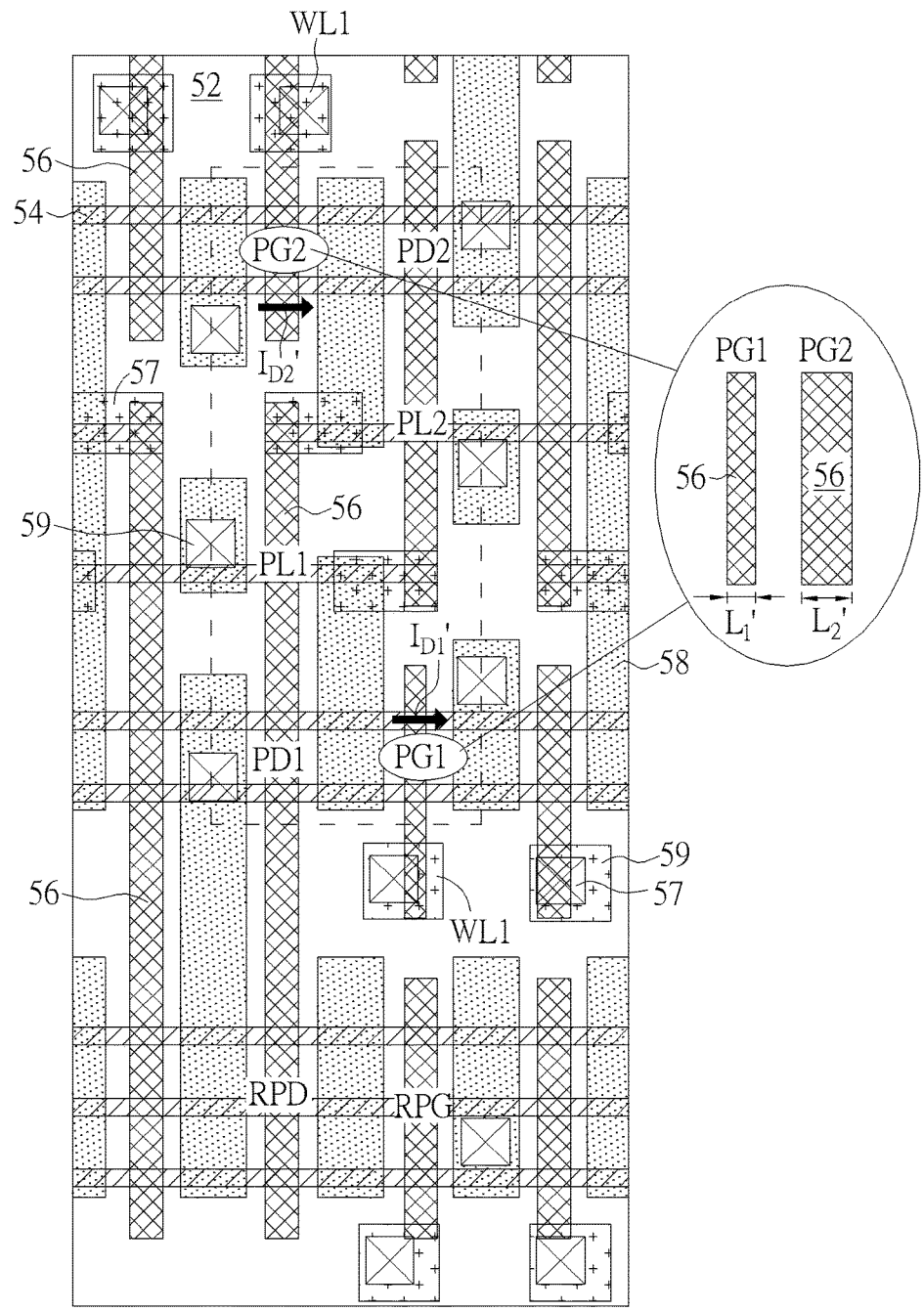
FIG. 5 illustrates a layout diagram of a SRAM according to a third preferred embodiment of the present invention.

In another embodiment of the present invention, please refer to FIGS. 4-5, FIG. 4 illustrates a circuit diagram of a SRAM cell according to a third preferred embodiment of the present invention, and FIG. 5 illustrates a layout diagram of a SRAM according to a third preferred embodiment of the present invention.

In this embodiment, an 8TRD-SRAM cell 12 includes a first pull-up transistor PL1', a second pull-up transistor PL2', a first pull-down transistor PD1' and a second pull-down transistor PD2', a first access transistor PG1 and a second access transistor PG2. In addition, the 8TRD-SRAM cell 12 further comprises two read transistors: RPG and RPD which are series connected to each other. The first pull-up transistor PL1', the second pull-up transistor PL2', the first pull-down transistor PD1 and the second pull-down transistor PD2 constitute a latch circuit 22'. Besides, in this embodiment, the first pull-up transistor PL1' and the second pull-up transistor PL2' share a source/drain region and electrically connect to a voltage source Vcc, and the first and the second pull-down transistors PD1' and PD2' share a source/drain region and electrically connect to a voltage source Vss.

Furthermore, the gates of the first access transistor PG1 and the second access transistor PG2 are respectively coupled to a word line (WL); the source of the first access transistor PG1 is coupled to a first bit line (BL1), the source of the second access transistor PG2 is coupled to a second bit line (BL2); the source of the read transistor RPG is coupled to a read bit line (RBL), the gate of the read transistor RPD is coupled to the latch circuit 22', and the drain of the read transistor RPD is coupled to the voltage source Vss.

In this embodiment, as shown in FIG. 5, the 8TRF-SRAM cell 12 is disposed on a substrate 52, such as a silicon substrate or silicon-on-insulator (SOI) substrate. The substrate may be a planar substrate, or a plurality of fin structures 54 may be formed on the substrate 52. Next, pluralities of gate structures 56 are formed on the substrate 52. In this embodiment, take an 8T-SRAM with fin structures 54 as an example, but the present invention is not limited thereto. In another case, the planar SRAM (the SRAM without comprising fin structures) may also be comprised within the scope of the present invention. Besides, in this embodiment, a plurality of contact structures 57, 58 are disposed on the substrate 52, and a plurality of contact plugs 59 which is electrically connected to the contact structures 57, 58. The other structure features and the operation principle of 8TDP-SRAM are well known to those skilled in the art, and will not be redundantly described here.

Similar to the preferred embodiment mentioned above, due to the reasons such as the layout difference in different regions, or the energy consumption, etc. . . . one issue may occur: the current passing through the first access transistor PG1 (the current from the source to the drain, labeled as ID1') is different from the current passing through the second access transistor PG2 (the current from the source to the drain, labeled as ID2'). For example, in 28 nanometers (nm) 8TRF-SRAM, according to the experiment of the applicant, the current ID1' that passes through the first access transistor PG1 is smaller than the current ID2' that passes through the second access transistor PG2 about 7-13%.

Hence, performing the OPC process mentioned above can adjust the current differences between the current ID1' and the current ID2'. More precisely, both the gate length L1' of the first access transistor PG1 and the gate length L2' of the second access transistor PG2 can be changed through an OPC process, for example, decreasing the gate length L1' or increasing the gate length L2' to decrease the current differences between the current ID1' and the current ID2'. In other words, the OPC process mentioned in the first preferred embodiment is applied to the 8TRF-SRAM of this embodiment. Except for the features mentioned above, the other components, material properties, and manufacturing method of this embodiment are similar to the first preferred embodiment detailed above and will not be redundantly described.

Figure 6:
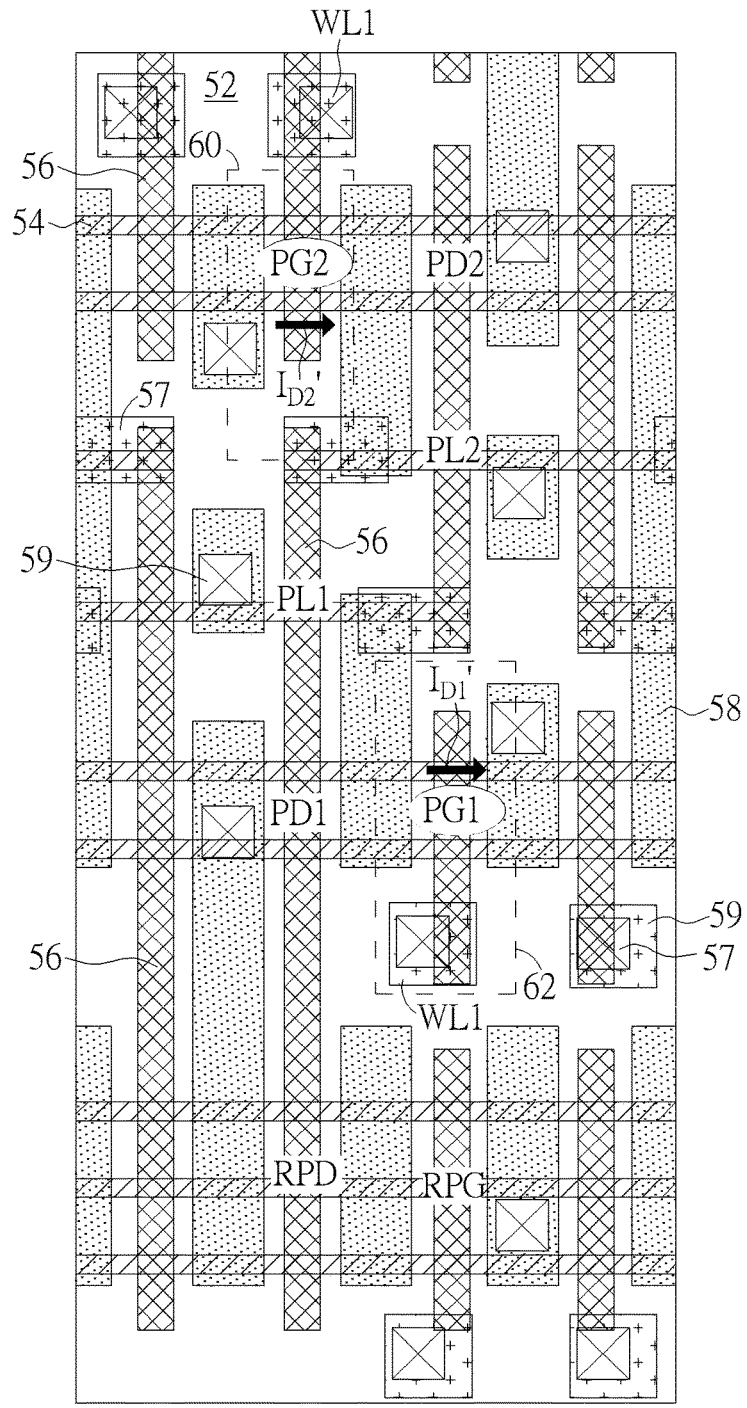
FIG. 6 illustrates a layout diagram of a SRAM according to a fourth preferred embodiment of the present invention.

Please refer to FIG. 6, which illustrates a layout diagram of a SRAM according to a fourth preferred embodiment of the present invention. Similar to the third preferred embodiment, this embodiment also comprises at least one 8TRF-SRAM cell 12, and having the same circuit diagram as the third preferred embodiment has (please refer to FIG. 4).

The difference between this embodiment and the third embodiment is in this embodiment, an ion implantation process is performed on the substrate surrounding the first access transistor PG1 or the second access transistor PG2, to form the doping region 60, 62 in the substrate. In this way, the threshold voltage of each transistor can be changed, so as to increase the current ID1' or to decrease the current ID2'. Except for the features mentioned above, the other components, material properties, and manufacturing method of this embodiment are similar to the second preferred embodiment detailed above and will not be redundantly described.

It is noteworthy that the third preferred embodiment and the fourth preferred embodiment can be combined together. In other words, in one case, an OPC process and an ion implantation process can be performed on a same 8TRF-SRAM, so as to adjust the gate length and also to change the threshold voltage, and to change the current passing through the transistor. It should also be within the scope of the present invention.

In summary, due to the reasons such as the layout difference in different regions, the currents passing through different elements are different. In order to solve this issue, the present invention provides a layout pattern of a SRAM and the manufacturing method for forming the layout pattern thereof. The present invention provides two methods: by performing an OPC process and by performing an ion implantation process to solve the issue mentioned above, the current differences in different regions can thereby be decreased and the quality of SRAM can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM), comprising:
a substrate, a SRAM pattern disposed on the substrate, wherein the SRAM pattern comprising:
a first inverter and a second inverter constituting a latch circuit, wherein the first inverter includes a first pull-up transistor (PL1) and a first pull-down transistor (PD1), and the second inverter includes a second pull-up transistor (PL2) and a second pull-down transistor (PD2);
a first inner access transistor (PG2A) and a second inner access transistor (PG2B) electrically connected to the latch circuit, wherein the first inner access transistor is electrically connected to a first word line and a second bit line, and the second inner access transistor is electrically connected to a second word line and a fourth bit line; and a first outer access transistor (PG1A) and a second outer access transistor (PG1B) electrically connected to the latch circuit, wherein the first outer access transistor is electrically connected to the first word line and a first bit line, and the second outer access transistor is electrically connected to the second word line and a third bit line, in addition, the first outer access transistor (PG1A) has a first gate length, the first inner access transistor (PG2A) has a second gate length, and the first gate length is different from the second gate length.

2. The SRAM of claim 1, further comprising performing an optical proximity correction (OPC) process to make the first gate length different from the second gate length.

3. The SRAM of claim 1, wherein a ratio of the second gate length and the first gate length is between 0.58 and 0.99.

4. The SRAM of claim 3, wherein a distance of the second gate length is from 14 nanometers to 24 nanometers.

5. The SRAM of claim 1, wherein a gate of the first inner access transistor (PG2A) directly contacts a gate of the first outer access transistor (PG1A).

6. The SRAM of claim 1, wherein a gate of the first inner access transistor (PG2A) and a gate of the first outer access transistor (PG1A) are arranged along a same symmetry axis.

7. The SRAM of claim 1, wherein a gate of the second inner access transistor (PG2B) and a gate of the second outer access transistor (PG1B) are arranged along a same symmetry axis.

8. The SRAM of claim 1, wherein the second outer access transistor has a third gate length, the second inner access transistor has a fourth gate length, and the third gate length is different from the fourth gate length.

9. The SRAM of claim 1, further comprising performing a second optical proximity correction (OPC) process to make the third gate length different from the fourth gate length.

10. The SRAM of claim 1, further comprising a plurality of fin structures disposed on the substrate.

* * * * *